United States Patent [19]

Yoshida et al.

[11] 4,175,965
[45] Nov. 27, 1979

[54] OFFSET PRINTING PLATE

[75] Inventors: Akio Yoshida; Yasuo Tsubai; Seigo Ebato, all of Nagaokakyo, Japan

[73] Assignee: Mitsubishi Paper Mills, Ltd., Tokyo, Japan

[21] Appl. No.: 846,024

[22] Filed: Oct. 27, 1977

[30] Foreign Application Priority Data

Nov. 1, 1976 [JP] Japan .................................. 51-131371
Sep. 26, 1977 [JP] Japan .................................. 52-115299

[51] Int. Cl.² .......................... G03C 5/54; G03C 1/48
[52] U.S. Cl. .................................... 430/230; 430/302; 430/598; 430/531; 430/591; 430/605; 430/606; 430/581; 430/583
[58] Field of Search ............... 96/29 L, 85, 87 R, 108, 96/101, 130, 132, 76 R, 33

[56] References Cited

PUBLICATIONS

Vanassche, et al., "The Journal of Photographic Science", 22, pp. 121-130, (1974).

Primary Examiner—Won H. Louie, Jr.
Attorney, Agent, or Firm—Cushman, Darby & Cushman

[57] ABSTRACT

An improved direct offset printing plate high in photographic speed which utilizes silver complex diffusion transfer is obtained by using as a silver halide emulsion a direct positive silver halide emulsion which comprises silver halide grains which contain at least 80 mol % of bromide, the surface of said silver halide grains having thereon an electron acceptor and at least one sensitizing dyes selected from the group consisting of those having the following general formula (I):

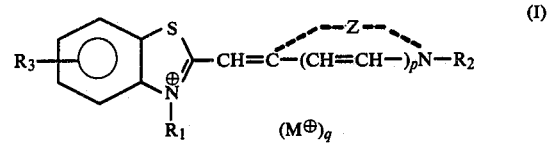

and those having the following general formula (II):

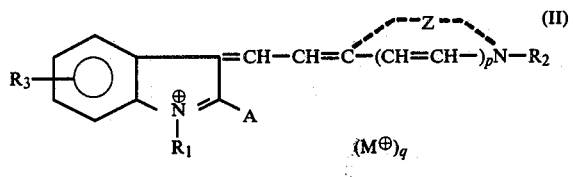

(wherein Z, $R_1$–$R_3$, M, A and p and q are as defined in the specification).

14 Claims, No Drawings

OFFSET PRINTING PLATE

BACKGROUND OF THE INVENTION

This invention concerns an offset printing plate and more particularly it relates to direct use of a silver image obtained by silver complex diffusion transfer process as an offset printing plate. That is, this invention relates to improvement of negative-type direct offset printing plates disclosed in U.S. Pat. No. 3,728,114, etc.

Negative-type direct offset printing plates can be advantageously obtained using direct-positive silver halide emulsions as silver halide photographic emulsions. Such negative-type direct offset printing plates are disclosed in Japanese Patent Applications No. 22829/76 and No. 27095/76. The former shows that the adhesion strength of silver image increases with increase in proportion of chloride in the silver halide emulsion and that emulsions comprising silver chlorobromide or silver chloroiodobromide grains containing at least 50 mol % of chloride, surfaces of which are substituted with not more than 2% of iodide are preferred for obtaining negative-type direct offset printing plate having high photographic speed and desirable printability. The latter shows that in order to obtain negative-type direct offset printing plates of higher photographic speed it is preferred to use silver halide emulsions comprising silver chlorobromide, silver iodobromide, silver chloroiodobromide or silver bromide grains which contain at least 80 mol % and furthermore for preventing reduction of printabilities it is preferred to limit the weight ratio of binder and silver to 1/5–2 and the coating amount of silver to 0.5–2.5 g/m². Moreover, Japanese Patent Application No. 95274/76 discloses that use of cationic cyanine dyes causes inhibition of diffusion transfer development and reduction in the deposition amount of silver while use of betaine type or anion type cyanine dyes results in prevention of reduction in the deposition amount of silver and preferred printabilities. Thus improved negative-type direct offset printing plates have fairly high photographic speed and fairly improved printabilities, but amount of transferred silver is still not sufficient, running strength tends to vary at every plate and is low and especially reproducibility of fine lines is not sufficiently high.

SUMMARY OF THE INVENTION

The inventors have found that high photographic speed can be obtained and the above-mentioned defects can be overcome by using direct-positive silver halide emulsions which comprise silver chlorobromide, silver iodobromide, silver chloroiodobromide or silver bromide grains which contain at least 80 mol % of bromide, the surface of said silver halide grains having thereon an electron acceptor and at least one sensitizing dyes selected from the group consisting of those having the following general formula (I):

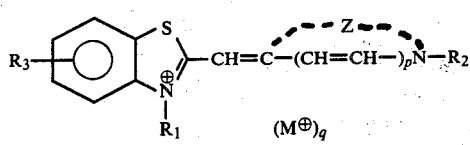

and those having the following general formula (II):

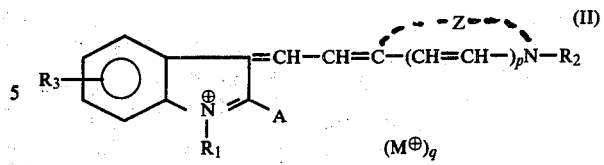

(wherein Z represents non-metal atom groups necessary to complete a 5- or 6- membered nitrogen-containing heterocyclic nucleus, at least one of $R_1$ and $R_2$ is sulfoalkyl or carboxyalkyl group which preferably has 1 to 5 carbon atoms and the remainder is an alkyl, a substituted alkyl, an aralkyl, an aryl or an alkenyl group, $R_3$ is nitro group, a halogen atom or hydrogen atom, A is an aryl group, M is an alkali metal atom or ammonium group and p and q each represents 0 or 1) and said silver halide grains being fogged with a metal compound more electropositive than silver without using a reducing agent.

It is an object of this invention to provide a negative-type direct offset printing plate of high photographic speed.

It is another object of this invention to provide a negative-type direct offset printing plate with excellent printabilities.

These and other objects will be clear from the following disclosure.

DESCRIPTION OF THE INVENTION AND THE PREFERRED EMBODIMENTS

The direct-positive silver halide emulsion referred to herein means the silver halide emulsion prepared so that a direct-positive image is formed through the steps of the usual exposure with light and the subsequent development. A direct-positive silver halide emulsion comprising fogged silver halide grains and an electron acceptor is known as disclosed in e.g., British Pat. No. 723,019.

A negative-type direct offset printing plate is objtained by providing a layer of direct-positive silver halide emulsion on a suitable support and then a surface layer containing nuclei for physical development of fine particles of heavy metals or sulfides thereof in such a manner that surface of at least a part of said particles is exposed. When thus obtained direct offset printing plate is exposed imagewise and developed, silver halide of unexposed area is reduced to silver while silver halide of exposed area is dissolved as silver complex, diffuses in the upper layer and is reduced and deposited with nuclei for physical development as catalytic nuclei to form a silver image. The portions where no silver image is exposed comprise protective colloids such as gelatin, polyvinyl alcohol, etc. and are hydrophilic while the portions of exposed silver image are oleophilic due to the deposited silver and have affinity to ink.

The nuclei for physical development on a film of silver halide emulsion coated on a support of a waterproof paper or a synthetic resin film are provided in such a manner that fine particles of heavy metals or sulfides thereof having a diameter of about 20–100 Å are uniformly and planely distributed at intervals of about 100–300 Å so that surface of at least a part of these particles is not completely buried by high molecular compound contained in the surface layer. The nuclei for physical development are preferably ultrafine particles of heavy metal sulfides having a size of 70–100 Å and more preferably ultrafine particles of palladium sulfide having a size of 70-100 Å.

The layer in which the heavy metal fine particles are dispersed in such distribution can be obtained by vacuum evaporation method, cathode spattering method, coating method, etc. According to the vacuum evaporation method, for example, silver may be evaporated and deposited under a reduced pressure of $10^{-3}$–$10^{-6}$ torr. on the surface of a suitable silver halide emulsion film coated on a polyester film. A film of so-called island structure which is formed at an initial stage of the formation of an evaporation film is the layer of the nuclei for physical development of this invention and can be easily obtained. Furthermore, according to the coating method, a hydrosol of, for example, silver having a size of about 50 Å may be prepared and this hydrosol applied in single layer to the surface of a silver halide emulsion film by a suitable method such as a dip coating method to obtain the distribution of the particles similar to the island structure of the vacuum evaporation film. Thus obtained sheet can be used as an offset printing plate of this invention. When a sol of fine particles of heavy metals or sulfides thereof is prepared by a chemical reaction, the amount of the high molecular compound added needs to be carefully controlled in view of protective action of colloid and increase of viscosity. In the present invention, various hydrophilic high molecular compounds such as gelatin, polyethylene glycol, carboxymethylcellulose, sodium alginate, etc. can be used, but the layer in which the nuclei for physical development are dispersed is very different from the commercially available nuclei-containing layer for silver complex diffusion transfer process. That is, in the present invention unless the thickness of the film of the high molecular compound is less than 20-30 Å the transferred silver film cannot be exposed over the surface and in such case the resultant sheet is not suitable as an offset printing plate. The commercial materials containing the nuclei for physical development have a film of a thickness of greater than hundreds of Å and the layer is a continuous film. On the other hand, in the nuclei-containing layer of this invention, the surfaces of the nuclei may be coated with a film of high molecular compound about 30 Å in thickness, but the layer is not a continuous film and the nuclei are dispersed and distributed as individual particles.

The silver halide emulsion used in this invention is silver chlorobromide, silver iodobromide, silver chloroiodobromide or silver bromide emulsion which contains at least 80 mol % of bromide and good results can be obtained with silver iodobromide or silver chloroiodobromide emulsion which contains at least 95 mol %. The silver halide crystal grains used in this invention may have any crystal habits, but more preferred result is obtained with cubic grains.

Gelatin is mainly used as a binder for silver halide emulsions used in this invention. Furthermore, photographically inert gelatin derivatives or water soluble synthetic polymers (e.g., polyvinyl acrylate, copolymer of acrylamide and acrylic acid, polyvinyl alcohol, polyvinylpyrrolidone, polyvinyl alginate, etc.) may be used alone or in combination with gelatin.

The silver halide emulsions used in this invention are fogged with compounds of a metal more electropositive than silver without reducing agent (such as thiourea dioxide). One example of these fogging methods is mentioned in W. Vanassche, H. Borginon, H. Pattyn, W. Peelaers and E. Moisar "The Journal of Photographic Science" 22, pp 121–130 (1974). That is, it is mentioned in this literature that the fogging is effected by addition of chloroauric acid at a low pAg without adding a reducing agent. Specific examples of the compounds of metals more electropositive than silver are gold salts such as potassium chloroaurate and the like, platinum salts such as potassium chloroplatinate and the like and iridium salts such as potassium hexachloroiridate and the like. Especially, a negative-type direct offset printing plate of higher photographic speed can be obtained using a gold salt such as potassium chloroaurate.

The electron acceptors used in this invention include the known desensitizers capable of trapping electrons as disclosed in British Pat. No. 723,019 and Japanese Patent Publication No. 3938/75. It is known that an anodic polarographic halfwave potential or a cathodic polarographic halfwave potential and an electron acceptability are strongly inter-related as disclosed in, e.g., R. W. Berriman and P. B. Gilman Jr. "Photographic Science and Engineering" 17, pp. 235–244 (1973). Therefore, it is preferred to use organic desensitizing dyes having an oxidation polarographic halfwave potential and a reduction polarographic halfwave potential which give a positive sum. Specific examples of the desensitizing dyes used in this invention are pinacryptol yellow, phenosafranine, Methylene Blue, pinacryptol green, 3-ethyl-5-m-nitrobenzylidenerhodanine, 3,3'-diethyl-6,6'-dinitrothiacarbocyanine iodide, etc. Among them, pinacryptol yellow gives especially good results.

The sensitizing dyes used in this invention are represented by the following general formulae (I) and (II):

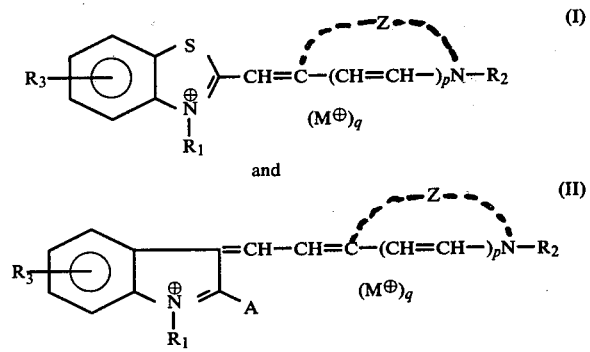

[wherein at least one of $R_1$ and $R_2$ represent sulfoalkyl group, preferably one having 1 to 5 carbon atoms (e.g., $\gamma$-sulfopropyl, $\delta$-sulfobutyl, etc.) or carboxyalkyl group, preferably one having 1 to 5 carbon atoms (e.g., $\beta$-carboxyethyl, $\gamma$-carboxypropyl, etc.) and the remainder of $R_1$ and $R_2$ represents an alkyl group, preferably one having 1 to 5 carbon atoms (e.g., methyl, ethyl, propyl, butyl, etc.), a substituted alkyl group, preferably one having 1 to 5 carbon atoms (e.g., hydroxyalkyl groups such as $\beta$-hydroxyethyl, $\gamma$-hydroxypropyl, etc., acyloxyalkyl groups such as $\beta$-acetoxyethyl, $\gamma$-acetoxypropyl, $\beta$-benzoyloxyethyl, etc., alkoxyalkyl groups such as $\beta$-methoxyethyl, $\beta$-ethoxyethyl, etc.), an alkenyl group (e.g., allyl), an aralkyl group (e.g., benzyl, phenetyl, etc.) or an aryl group (e.g., phenyl, p-nitrophenyl, etc.), $R_3$ represents nitro group, a halogen atom, or hydrogen atom, A represents an aryl group (e.g., phenyl, p-nitrophenyl, p-methoxyphenyl, p-tolyl, etc.), M represents an alkali metal atom or ammonium group, p and q represent 0 or 1 and Z represents a nonmetal atom group necessary to complete a 5- or 6-membered nitrogen-containing heterocyclic nucleus, specific examples of which are benzothiazole nuclei (e.g., benzothiazole, 4-chlorobenzothiazole, 5-chlorobenzothiazole, 6-chlorobenzothiazole, 7-chlorobenzothiazole, 5-methylbenzothiazole, 6-methylbenzothiazole, 5,6-dimethylbenzothiazole, 5-bromobenzothiazole, 6-bromobenzothiazole, 5-phenylbenzothiazle, 4-methoxy benzothiazole, 5-methoxybenzothiazole, 6-methoxybenzothiazole, 6-iodobenzothiazole, 5-methoxycarbonylbenzothiazole, 5-ethoxybenzothiazole, tetrahydrobenzothiazole, 5-N,N-dimethylaminobenzothiazole, 5-hydroxybenzothiazole, 6-hydroxybenzothiazole, 5-carboxybenzothiazole, 5-nitrobenzothiazole, 6-nitrobenzothiazole, 5-chloro-6-nitrobenzothiazle, 5,6-methylenedioxybenzothiazole, etc.), naphthothiazole nuclei (e.g., α-naphthothiazole, β-naphthothiazole, 5-methoxy-β-naphthothiazole, 5-ethoxy-β-naphthothiazole, 8-methoxy-α-naphthothiazle, 7-methoxy-α-naphthothiazole, etc.), 2-quinoline nuclei (e.g., 2-quinoline, 3-methylquinoline, 5-methylquinoline, 7-methylquinoline, 8-methyhlquinoline, 6-chloroquinoline, 8-chloroquinoline, 6-methoxyquinoline, 6-ethoxyquinoline, 6-hydroxyquinoline, 8-hydroxyquinoline, etc.), 4-quinoline nuclei (e.g., 4-quinoline, 6-methoxyquinoline, 7-methylquinoline, 8-methylquinoline, etc.), indolenine nuclei (e.g., 3,3-dimethylindolenine, 3,3,5-trimethylindolenine, 3,3,7-trimethylindolenine, 5-hydroxy-3,3-dimethylindolenine, 6-chloro-3,3-dimethylindolenine, 3,3-dimethyl-5-nitroindolenine, etc.), 2-naphthyridine (1,8) nuclei (e.g., 1,8-naphthyridine, 4-methyl-1,8-naphthryidine, 6-methyl-1,8-naphthrydine, 7-methyl-1,8-naphthyridine, etc.), 4-naphthyridine (1,8) nuclei (e.g., 1,8-naphthyridine, 2-methyl-1,8-naphthyridine, 5-methyl-1,8-naphthyridine, 6-methyl-1,8-naphthyridine, etc., benzoxazole nuclei (e.g., benzoxazole, 5-chlorobenzoxazole, 5-nitrobenzoxazole, 6-nitrobenzoxazole, 5-chloro-6-nitrobenzoxazole, 6-hydroxybenzoxazole, 5-methylbenzoxazole, etc.), naphthoxazole nuclei (e.g., α-naphthoxazole, β-naphthoxazole, 7-methoxy-α-naphthoxazole, 8-methoxynaphthoxazole, etc.), imidazo[4,5-b]quinoxaline nuclei (e.g., 1,3-diethylimidazo[4,5-b]quinoxaline, 6-chloro-1,3-diethylimidazo[4,5b]quinoxaline, 1,3-diallylimidazo[4,5-b]quinoxaline, 6,7-dichloro-1,3-diallylimidazoquinoxaline, 1,3-diphenylimidazoquinoxaline, 6-chloro-1,3-diphenylimidazoquinoxaline, etc.), 3,3-dialkyl-3H-pyrrolo[2,3-b]pyridine nuclei (e.g., 3,3-dimethyl-3H-pyrrolo[2,3-b]pyridine, 3,3-diethyl-3H-pyrrolo[2,3-b]pyridine, etc.), thiazole[4,5-b]pyridine nuclei (e.g., thiazolo[4,5-b]pyridine, etc.), thiazolo[4,5-b]quinoline nuclei (e.g., thiazolo[4,5-b]quinoline, etc.), oxazolo[4,5-b]pyridine nuclei (e.g., oxazolo[4,5-b]pyridine, etc.) oxazolo[4,5-b]quinoline nuclei (e.g., oxazolo[4,5-b]quinoline, etc.)].

Method for synthesis of the dyes of the general formula (I) is disclosed in, e.g., Japanese Patent Application Kokai (Laid-Open) No. 25621/75 and they can be produced in the same manner as mentioned therein.

The cyanine dyes represented by the general formul (II) are easily synthesized by the method well known in the preparation of cyanine dye.

As the typical example, a method for synthesis of dye (9) is illustrated below in detail.

Intermediate (A)

In 400 ml of methanol were dissolved 36.6 g of 1,3-propanesultone and 49.8 g of potassium iodide. The resulting solution was refluxed under heating for 30 minutes, and then cooled to room temperature. The precipitated solids were filtered off, washed with methanol, and dried to obtain 81.5 g of white solids.

Intermediate (B)

In 200 ml of dimethyl sulfoxide was dissolved 11.2 g of potassium hydroxide and to the resulting solution was added a mixture of 38.6 g of 2-phenylindole and 57.6 g of the intermediate (A) obtained above. The resulting solution was stirred at room temperature for 5 hours and then at 40°–50° C. for further one hour. Then, the dimethyl sulfoxide was distilled away under reduced pressure. To the resulting residue was added 200 ml of ethanol and then the precipitated insoluble matters were filtered away. The filtrate was allowed to stand overnight to precipitate solids. The precipitated solids were filtered off, washed with a small amount of ethanol, and dried to obtain 19.7 g of white to yellowish white solids. NMR (D$_2$O): proton at the 3-position in the indole ring. 6.1 ppm (1H, S) Intermediate (C)

Into 18 ml of dimethylformamide was added dropwise 6 ml of phosphorus oxychloride under ice-cooling and with stirring. After the dropwise addition, the resulting mixture was further stirred for 15 minutes. Then, a mixture of 10.6 g of the intermediate (B) obtained above and 60 ml of dimethylformamide was added dropwise thereto in about 30 minutes. After the completion of the addition, the resulting mixture was stirred for 15 minutes, heated to 35°–45° C. and further stirred for further one hour at the temperature. Then, the resulting reaction solution was poured into 600 ml of ice-cold water. To the resulting solution was added 100 ml of 5 N-potassium hydroxide and the mixture was heated to 60°–70° C. and then ice-cooled. The precipitated insoluble matters were filtered away. The resulting filtrate was evaporated to dryness under reduced pressure, and the residue was extracted under heating with three 50 ml portions of ethanol. The resulting extract was evaporated to dryness under reduced pressure. To the residue was added a 1:1 solution of chloroform and methanol, and the precipitated solids were filtered off, washed with ethanol and dried to obtain 5.4 g of almost white solids. NMR (DMSO-d$_6$): formylproton at the 3-position in the indole ring. 9.6 ppm (1H, S)

Synthesis of dye (9)

A mixture of 0.12 g of 3-ethyl-2-methylbenzothiazolium-p-toluenesulfonate, 0.12 g of the intermediate (C) obtained above and 0.5 ml of acetic anhydride was refluxed under heating for 15 minutes. To the reaction solution was added ether and the precipitated coarse dyes were filtered off, washed with water, recrystallized from hydrous ethanol and dried to obtain dye (9) having a melting point of 234.0°–236.0° C. and the absorption maximum value in methanol solution of 486 nm.

Typical examples of the dyes used in this invention are as follows:

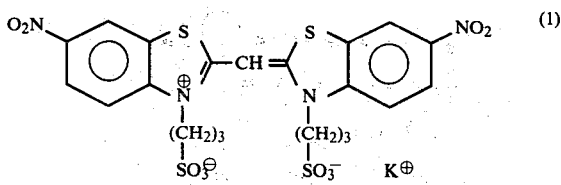

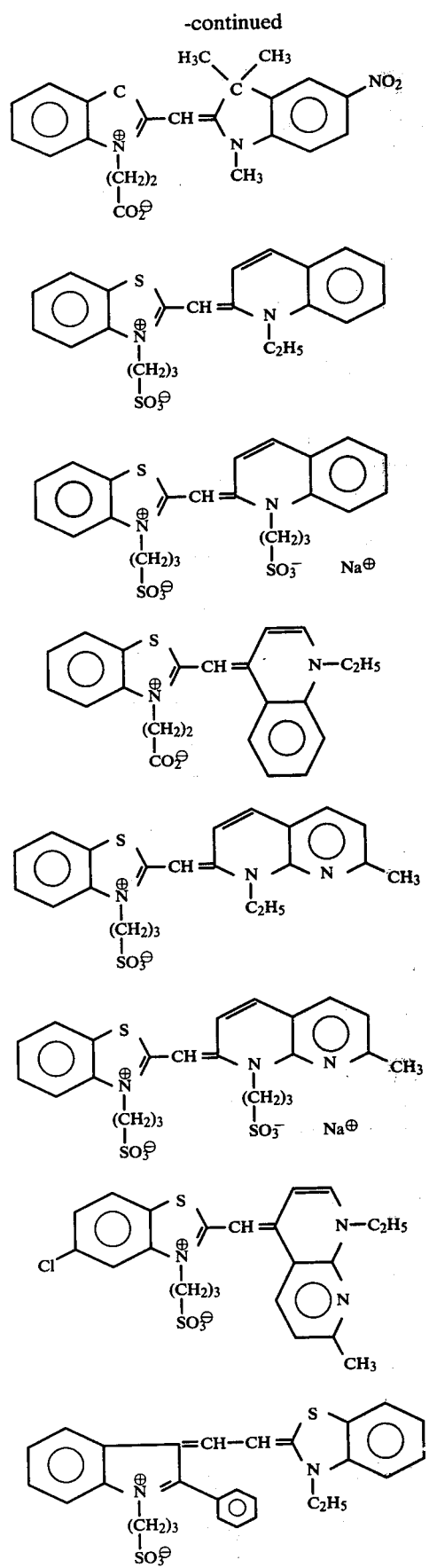
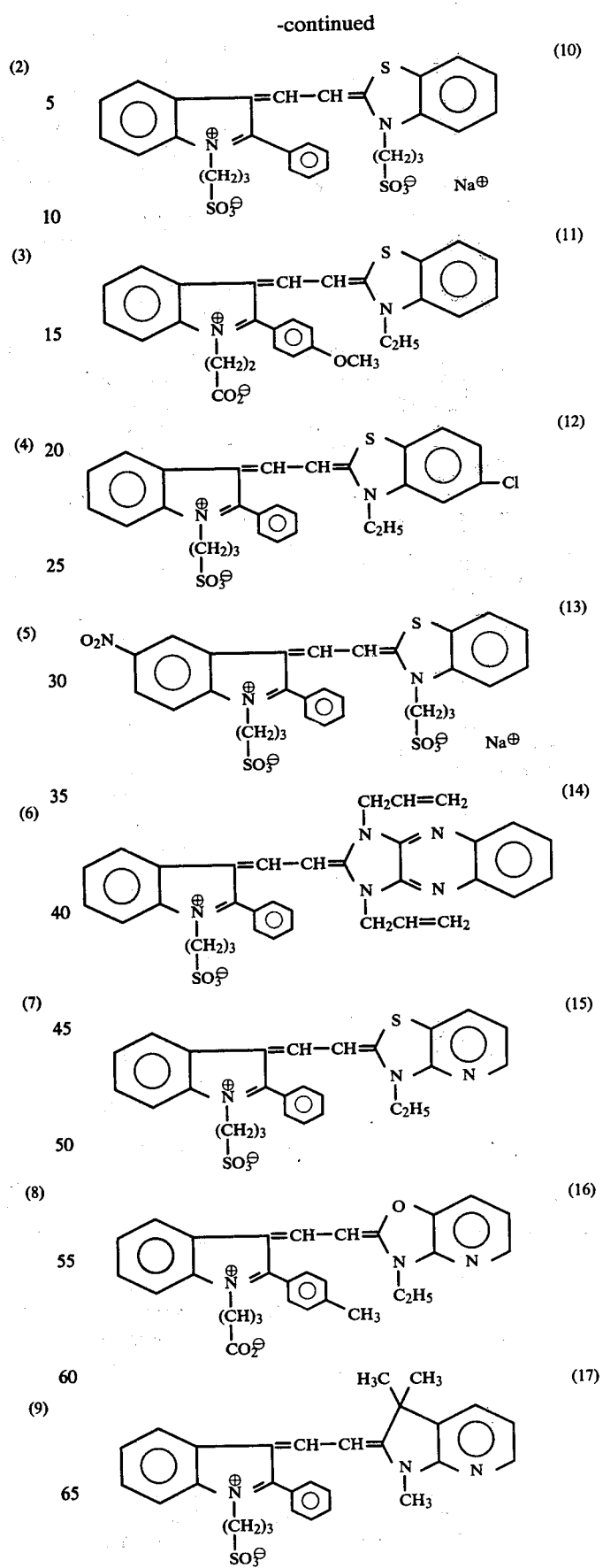

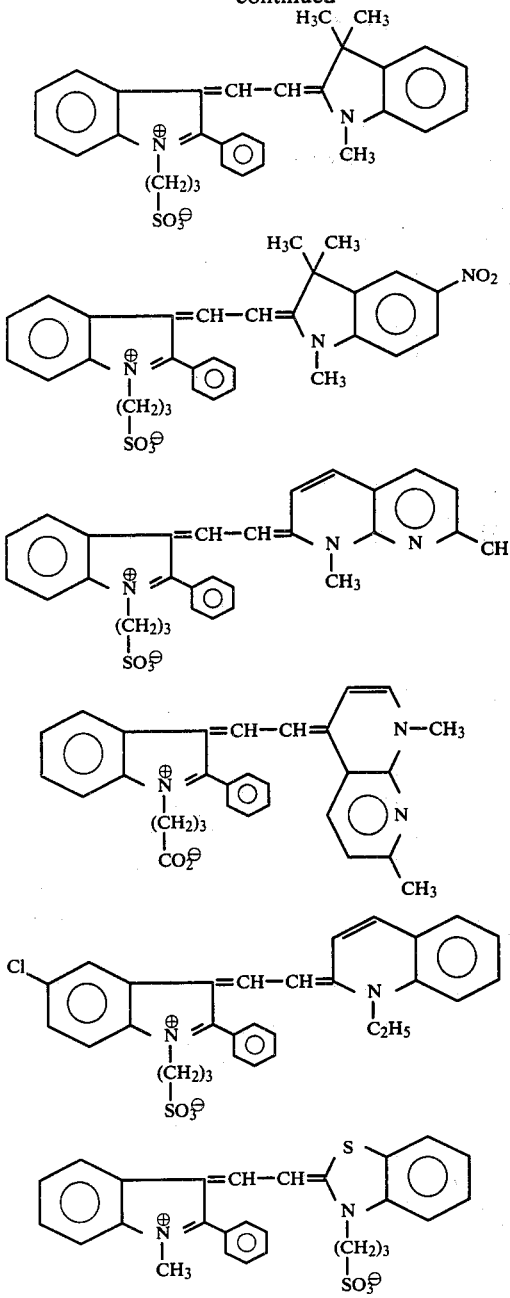

In this invention, the silver halide emulsions can contain various additives such as stabilizers for fogging nuclei, brighteners, ultraviolet absorbers, hardeners, surfactants, preservatives, plastisizers, matting agents and the like.

Examples of supports used in this invention are resin films such as polyethylene terephthalate, cellulose acetate, etc., synthetic papers, waterproof papers and the like. Preferably these supports are subjected to corona discharge treatment or undercoating treatment to give them adhesion strength sufficient to stand offset printing.

Plate making process will be explained below. The printing plate of this invention is subjected to contact printing of an original or reduction or enlargement of an original depending upon photographic speed of silver halide emulsion or purpose for use. Thereafter, thus treated plate is processed with a monobath transfer developer containing a solvent for silver halides, e.g., the Mitsubishi Silver Master SLM-SL developer for 30 seconds to one minute to obtain an offset printing plate and offset printing can be carried out. When the plate is processed with a developer for silver complex diffusion transfer, the unexposed silver halide is developed to blackened silver and exposed silver halide is converted into soluble silver complex ion, which diffuses to the surface and is selectively reduced to deposit on the surface of fine particles of nuclei for physical development. However, since the layer of the nuclei is not to be buried by the coating of the high molecular compound, the deposited metallic silver forms a silver image whose surface is exposed and has oleophilic property. Two-bath processing with a developer of silver halide emulsion and a transfer solution in place of the mono-bath processing requires 3–5 minutes, but is suitable in the case of such originals as having soft gradation.

The first characteristic of this invention is that negative-type offset printing plates of high photographic speed can be obtained.

The second characteristic is that rapid plate-making can be attained and direct offset printing plates excellent in printabilities can be obtained.

This invention is further illustrated by the following examples although these examples are not intended to limit the scope of the invention.

EXAMPLE 1

Emulsion was prepared as follows:

| | | |
|---|---|---|
| (I) | Gelatin | 32 g |
| | Water | 220 ml |
| | Sodium chloride | 9.6 g |
| (II) | Silver nitrate | 96 g |
| | Water | 800 ml |
| (III) | Potassium bromide | 68 g |
| | Potassium iodide | 1.28 g |
| | Phodium chloride solution* | 2.4 ml |
| | Ammonia (28 %) | 80 ml |
| | Water | 740 ml |
| (IV) | Glacial acetic acid | |

*This solution was prepared by dissolving 0.1 g of RhCl$_2$ . 4H$_2$O in 100 ml of 25% aqueous solution of sodium chloride.

At 40° C., liquid (II) was added to liquid (I) and liquid (III) was added thereto with agitation. Then, after digestion at 40° C. for 10 minutes, liquid (IV) was added to adjust the pH to 4.0 and aqueous solution of sulfuric acid was added to form a precipitate, which was washed with water. This primitive emulsion was a chloroiodobromide emulsion containing at least 95 mol % of bromide. This was called primitive emulsion No. 1.

The primitive emulsion No. 1 was redissolved and gelatin was added to adjust the weight ratio of gelatin and silver to 1.2 and thereafter pH and pAg were adjusted to 6.5 and 5.0, respectively. Then, 3.0 mg/mol Ag of potassium chloroaurate was added to fog the emulsion at 60° C. for 1 hour. Then, pAg was adjusted to 8.0 and thereafter 400 mg/mol Ag of dye (3) enumerated hereinbefore was added and 200 mg/mol Ag of pinacryptol yellow was added thereto. Then, a hardener, a surfactant and a matting agent were added. The resultant emulsion was coated on an under coated waterproof paper and dried. The amount of coated silver was 1.3 g/m².

Then, a palladium sulfide sol was prepared in the following formulation.

| | | |
|---|---|---|
| (V) | Palladium chloride | 5 g |
| | Hydrochloric acid | 40 ml |
| | Water | 1 l |
| (VI) | Sodium sulfide | 8.6 g |
| | Polyethylene glycol alkyl ether 10% | 30 ml |
| | Water | 1 l |
| (VII) | Copolymer of methylvinylether and maleic anhydride (Gantrez AN of GAF Co.) | 100 ml |

Liquid (V) and liquid (VI) were mixed with agitation and then liquid (VII) was mixed therewith. The resultant palladium sulfide sol was coated on the emulsion layer at a rate of 5 m/min by dipping method. Thus obtained sheet was called sheet (A).

Separately, sheet (B) was produced in the same manner as mentioned above except that pAg was adjusted to 6.0 instead of 4.6 and 0.3 mg/mol Ag of thiourea dioxide was added besides 3.0 mg/mol Ag of potassium chloroaurate.

Thus obtained sheets (A) and (B) were cut to suitable size and these were exposed through a wedge of 0.15 in density differences and were processed with Mitsubishi Silver Master SLM-SL developer (processing solution for silver complex diffusion transfer) at 30° C. for one minute, then stopped and washed with water. The results are shown in Table 1.

Table 1

| | Fogging conditions | | Relative photo-graphic speed | Amount of deposited silver |
|---|---|---|---|---|
| Sheet | Thiourea dioxide | KAuCl₄ | | |
| (A) | 0 | 3.0 mg/mole Ag | 141 | Larger than in sheet (B) |
| (B) | 0.3 mg/mole Ag | 3.0 mg/mole Ag | 100 | Smaller than in sheet (A) |

The relative photographic speed in Table 1 is a relative value of a reciprocal of exposure amount at the critical point at which no deposition of silver occurs.

The sheets (A) and (B) were subjected to enlargement by a plate-making camera. Then, they were developed by Hishirapid processer using Mitsubishi Silver Master SLM-SL developer. Thereafter, they were processed with fixing solution (VIII) and dampening solution (IX) for offset printing and they were set in an offset printing machine (Type 250 manufactured by Addressograph.Multigraph Corp. in U.S.A.) and printing was carried out.

| | | |
|---|---|---|
| Fixing solution (VIII) | | |
| | Ammonium dihydrogenphosphate | 25 g |
| | Carboxymethylcellulose | 2.5 g |
| | Water to make | 1 l |
| Dampening solution (IX) | | |
| | Ammonium dihydrogenphosphate | 1 g |
| | Nickel nitrate-hexahydrate | 1.5 g |
| | Carboxymethylcellulose | 0.4 g |
| | Glycerine | 10 g |
| | Water to make | 1 l |

Usual offset ink was used as a printing ink. More than 2,000 copies were obtained using the sheet (A) while about 1,000 copies were obtained using the sheet (B). Thus, the negative-type direct offset printing plate of this invention had excellent printability.

EXAMPLE 2

Emulsion was prepared as follows:

| | | |
|---|---|---|
| (X) | Gelatin | 5 g |
| | 0.1N aqueous solution of potassium bromide | 20 ml |
| | 1N Sulfuric acid | 5 ml |
| | Water to make | 200 ml |
| (XI) | Silver nitrate | 136 g |
| | Water to make | 400 ml |
| (XII) | Potassium bromide | 92.8 g |
| | Potassium iodide | 3.3 g |
| | Water to make | 400 ml |
| (XIII) | 6N Sulfuric acid | |

To the liquid (X) kept at 60° C. were added simultaneously the liquids (XI) and (XII) with vigorous agitation over a period of 80 minutes and pAg was controlled to 7.4 during the addition. Then, the liquid (XIII) was added to adjust pH to 3.0 and gelatin was added to obtain a weight ratio of gelatin/silver of 0.6. Thereafter, an aqueous solution of sodium sulfate was added to form a precipitate, which was washed with water. The resultant primitive emulsion was a cubic monodispersed silver iodobromide emulsion containing 97.5 mol % of bromide and having a mean grain size of 0.25μ, at least 95% by weight of grains having size which was within ±20% of the mean grain size. This primitive emulsion was called primitive emulsion No. 2. After redissolving this primitive emulsion, gelatin was added to adjust a weight ratio of gelatin/silver to 1 and then pH and pAg were adjusted to 6.5 and 4.6, respectively. Thereafter, 3.0 mg/mol Ag of chloroauric acid was added to fog the emulsion at 60° C. for 1 hour. After adjusting the pAg to 8.0, each of dye (1), dye (5), dye (6) and dye (7) enumerated hereinbefore and the following dye (a), dye (b) and dye (c) as comparative dyes was added in the amounts as shown in Table 2 and then 200 mg/mol Ag of pinacryptol yellow was added to each of the emulsions and a hardner, a surfactant and a matting agent were added thereto. Each of the emulsions was coated on an undercoated polyethylene terephthalate film and was dried. The amount of silver coated was 1.3 g/m².

Then, palladium sulfide sol was coated thereon in the same manner as in Example 1. Thus obtained sheets were called sheets (C), (D), (E), (F), (G), (H), (J) and (K) as shown in Table 2.

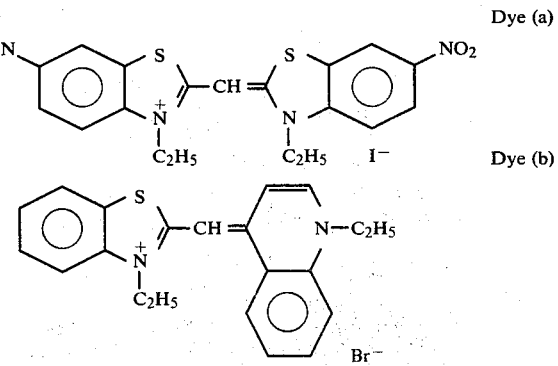

Dye (a)

Dye (b)

-continued   Dye (c)

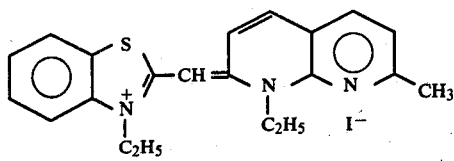

Thus obtained sheets (C), (D), (E), (F), (G), (H), (J) and (K) were cut to suitable sizes and were exposed through a wedge having a density difference of 0.15. Then, these were processed with Mitsubishi Silver Master SLM-SL developer (a processing solution for silver complex diffusion transfer) at 30° C. for 1 minute, then stopped and washed with water. The results are shown in Table 2.

As is clear from Table 2, in the case of sheets (E), (G) and (K), amount of silver deposited was small and edge effect occurred and these sheets are not preferred for printing. When printing was carried out using these sheets in the same manner as in Example 1, only less than 500 copies were obtained with each sheet.

Table 2

| Sheets | Dyes | Amount of dyes (mg/mole Ag) | Relative photo-graphic speed | Amount of deposited silver | ** Edge effect |
| --- | --- | --- | --- | --- | --- |
| (C) | Blank | 0 | 100 | Great | None |
| (D) | (1) | 300 | 282 | Great | None |
| (E) | (a) | 300 | 141 | Small | Occurred |
| (F) | (5) | 600 | 398 | Great | None |
| (G) | (b) | 600 | 199 | Small | Occurred |
| (H) | (6) | 400 | 603 | Great | None |
| (J) | (7) | 400 | 417 | Great | None |
| (K) | (c) | 400 | 282 | Small | Occurred |

** The edge effect means that there occurs difference in the amount of silver deposited at the edge of the silver image and other part of the silver image and unevenness in printing occurs. Therefore, the edge effect is not preferrred for printing.

On the other hand, sheets (D), (F), (H) and (J) of this invention had photographic speed about 3 times, about 4 times, about 6 times and about 4 times that of sheet (C) and were nearly the same in the amount of silver deposited as sheet (C). Furthermore, they had no edge effect. When printing was carried out using these sheets of this invention in the same manner as in Example 1 more than 2,000 copies were obtained with each sheet. As is clear from these results, the negative-type direct offset printing plates of this invention had high photographic speed and excellent printability.

EXAMPLE 3

After redissolving primitive emulsion No. 2 of Example 2, gelatin was added to adjust the weight ratio gelatin/silver to 1 and then pH and pAg were adjusted to 6.5 and 4.0, respectively. Then, 20.0 mg/mol Ag of potassium hexachloroiridate was added to fog the emulsion at 60° C. for 1 hour. After pAg was adjusted to 8.0, 600 mg/mol Ag of dye (4) enumerated hereinbefore was added and 200 mg/mol Ag of pinacryptol yellow was added and a hardener, a surfactant and a matting agent were added. This emulsion was coated on an undercoated polystyrene synthetic paper and was dried. The amount of silver coated was 1.3 g/m².

Thereafter, palladium sulfide sol was coated thereon in the same manner as in Example 1. Thus obtained sheet was called sheet (L).

Separately, sheet (M) was produced in the same manner as mentioned above except that pAg was adjusted to 6.0 instead of 4.4 and 1.0 mg/mol Ag of thiourea dioxide was added besides 20.0 mg/mol Ag of potassium hexachloroiridate.

Thus obtained sheets (L) and (M) were cut to suitable sizes. These were exposed through a wedge of 0.15 in density difference, thereafter processed with Mitsubishi Silver Master SLM-SL developer (processing solution for silver complex diffusion transfer) at 30° C. for 1 minute, then stopped and washed with water. The results are shown in Table 3.

Table 3

| | Fogging conditions | | Relative photo-graphic speed | Amount of the deposited silver |
| --- | --- | --- | --- | --- |
| Sheets | Thiourea dioxide | $K_2IrCl_6$ | | |
| (L) | 0 | 20 mg/mole Ag | 141 | Larger than in (M) |
| (M) | 1.0 mg/mole Ag | 20 mg/mole Ag | 100 | Smaller than in (L) |

When printing was carried out using the sheets (L) and (M), about 1,000 copies were obtained with the sheet (M) while more than 2,000 copies were obtained with the sheet (L). Thus, the negative direct offset printing plate of this invention had excellent printability.

EXAMPLE 4

Example 1 was repeated with the exception that in place of dye (3) dye (9) was used. The results are shown in Table 4.

Table 4

| | Fogging conditions | | Relative photo-graphic speed | Amount of deposited silver |
| --- | --- | --- | --- | --- |
| Sheets | Thiourea dioxide | $KAuCl_4$ | | |
| (N) | 0 | 3.0 mg/mole Ag | 172 | Larger than in sheet (Q) |
| (Q) | 0.3 mg/mole Ag | 3.0 mg/mole Ag | 100 | Smaller than in sheet (N) |

As in Example 1, the sheet (N) was superior to the sheet (Q) as the result of conducting the printing.

EXAMPLE 5

Example 1 was repeated with the exception that in place of dye (3) dye (23) was used.

The characteristic features of sheets and the results after printing were as the same as in Example 1.

EXAMPLE 6

Example 2 was repeated with the exception that in place of the respective dyes dyes shown in Table 5 and the following dyes (d) to (i) were used.

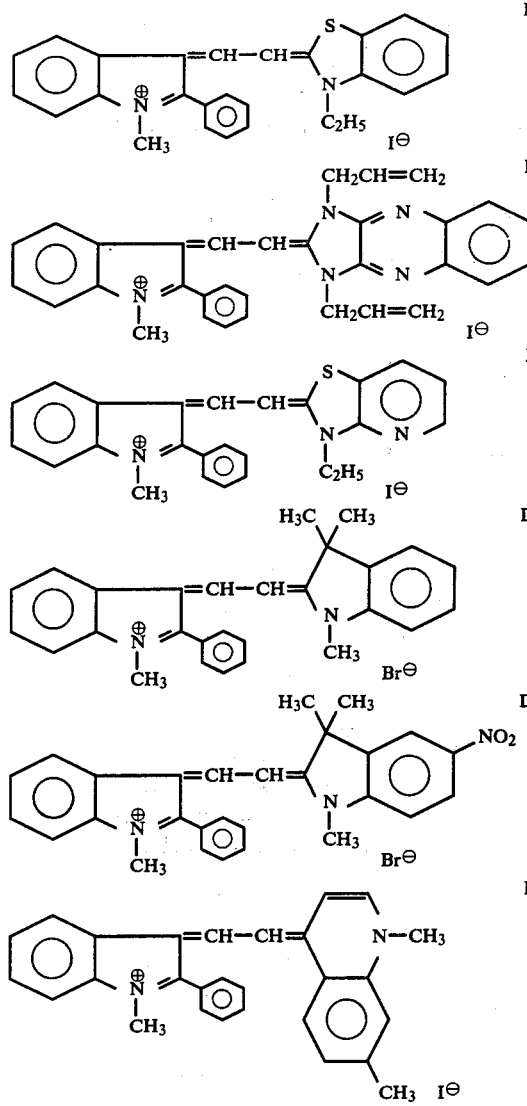

The results obtained are shown in Table 5.

Table 5

| Sheets | Dyes | Amount of dyes (mole/mole Ag) | Relative photographic speed | Amount of deposited silver | Edge effect |
|---|---|---|---|---|---|
| (P) | Blank | 0 | 100 | Great | None |
| (Q) | (9) | $6.6 \times 10^{-4}$ | 714 | Great | None |
| (R) | (10) | $6.6 \times 10^{-4}$ | 442 | Great | None |
| (S) | (d) | $6.6 \times 10^{-4}$ | 312 | Small | Occurred |
| (T) | (14) | $4.4 \times 10^{-4}$ | 791 | Great | None |
| (U) | (e) | $4.4 \times 10^{-4}$ | 340 | Small | Occurred |
| (V) | (15) | $6.6 \times 10^{-4}$ | 705 | Great | None |
| (W) | (f) | $6.6 \times 10^{-4}$ | 312 | Small | Occurred |
| (X) | (18) | $8.8 \times 10^{-4}$ | 603 | Great | None |
| (Y) | (g) | $8.8 \times 10^{-4}$ | 282 | Small | Occurred |
| (Z) | (19) | $6.6 \times 10^{-4}$ | 714 | Great | None |
| (x) | (h) | $6.6 \times 10^{-4}$ | 312 | Small | Occurred |
| (y) | (21) | $6.6 \times 10^{-4}$ | 282 | Great | None |
| (z) | (i) | $6.6 \times 10^{-4}$ | 141 | Small | Occurred |

As is clear from Table 5, though every sheet added with dye showed sensitizing effect, in case of sheets (S), (U), (W), (Y), (x) and (z) amount of silver deposited was small and edge effect occurred and these sheets are not preferred for printing. When printing was carried out using these sheets in the same manner as in Example 1, only less than 500 copies were obtained with each sheet.

On the other hand, sheets (Q), (R), (T), (V), (X), (Z) and (y) of this invention had photographic speed about 7 times, about 4.5 times, about 8 times, about 7 times, about 6 times, about 7 times and about 3 times that of sheet (P) and were nearly the same in the amount of silver deposited as sheet (P). Further, they had no edge effect. When printing was carried out using these sheets of this invention in the same manner as in Example 1, more than 3,000 copies were obtained with each sheet. As is clear from these results, the negative-type direct offset printing plates of this invention had high photographic speed and excellent printability.

What is claimed is:

1. In a direct offset printing plate which cmprises a support of a waterproof paper or synthetic resin film the surface of which is rendered hydrophillic and on which are coated a photographic emulsion layer mainly composed of a silver halide emulsion and a film layer which contains nuclei for physical development and to which an image formed in said emulsion layer is transferred from the emulsion layer comprising a direct positive silver halide emulsion which comprises silver chlorobromide, silver iodobromide, silver chloroiodobromide or silver bromide grains containing at least 80 mol % of bromide, the surface of which has an electron acceptor and at least one sensitizing dye selected from the group consisting of those having the following general formula (I):

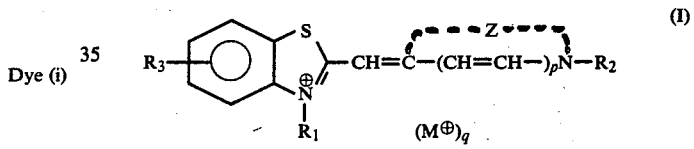

and those having the following general formula (II):

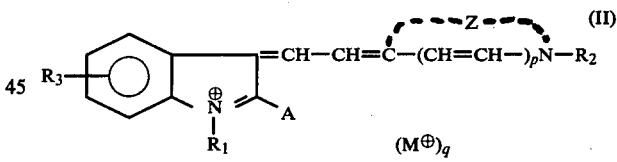

(wherein Z represents non-metal atom group necessary to complete a 5- or 6-membered nitrogen-containing heterocyclic nucleus, at least one of $R_1$ and $R_2$ represents a sulfoalkyl group of 1-5 carbon atoms or a carboxyalkyl group of 1-5 carbon atoms and the remainder of $R_1$ and $R_2$ represent an alkyl group of 1-5 carbon atoms, a substituent-containing alkyl group of 1-5 carbon atoms, an aralkyl group, an aryl group or an alkenyl group of 1-5 carbon atoms, $R_3$ represents nitro group, a halogen atom or hydrogen atom, A represents an aryl group, M represents an alkali metal atom or ammonium group and p and q each represents each represents 0 or 1) and which is fogged with a compound of a metal more electropositive than silver without a reducing agent and wherein said film layer containing nuclei for physical development has a thickness less than 20-30 Å.

2. A direct offset printing plate according to claim 1, wherein the compound of a metal more electropositive than silver is a gold salt.

3. A direct offset printing plate according to claim 1, wherein the nuclei for physical development are ultrafine particles of a heavy metal sulfide of 20–100 Å in diameter.

4. A direct offset printing plate according to claim 3, wherein the heavy metal sulfide is palladium sulfide.

5. A direct offset printing plate according to claim 1, wherein the silver halide grains are silver iodobromide or silver chloroiodobromide grains containing at least 95 mol % of bromide.

6. A direct offset printing plate according to claim 1, wherein the electron acceptor is a desensitizing dye having an oxidation polarographic halfwave potential and a reduction polarographic halfwave potential which give a positive sum.

7. A direct offset printing plate according to claim 6, wherein the desensitizing dye is pinacryptol yellow.

8. A direct offset printing plate according to claim 1, wherein the sensitizing dye is anhydro-3-ethyl-1'-(3-sulfopropyl)thia-2'-cyaninehydroxide.

9. A direct offset printing plate according to claim 1, wherein the sensitizing dye is anhydro-7-methyl-1-(3-sulfopropyl)-2-(1,8-naphthyridino)-2'-thiacyaninehydroxide.

10. A direct offset printing plate according to claim 1, wherein the sensitizing dye is anhydro-3-ethyl-2'-phenyl-1'-(3-sulfopropyl)-3'-indo-2-thiacarbocyaninehydroxide.

11. A direct offset printing plate according to claim 1, wherein the sensitizing dye is anhydro-1,3,3-trimethyl-2'-phenyl-1'-(3-sulfopropyl)-3'-indo-2-indolocarbocyaninehydroxide.

12. A direct offset printing plate according to claim 1, wherein the sensitizing dye is anhydro-1,3,3-trimethyl-5-nitro-2'-phenyl-1'-(3-sulfopropyl)indo-2-indolocarbocyaninehydroxide.

13. A direct offset printing plate according to claim 1, wherein the sensitizing dye is anhydro-1,3-diallyl-2'-phenyl-1'-(3-sulfopropyl)indo-2-imidazo[4,5-b]quinoxalinocarbocyaninehydroxide.

14. In a method for producing a direct offset printing plate which comprises a support of a waterproof paper or synthetic resin film the surface of which is rendered hydrophillic and on which are coated a photographic emulsion layer mainly composed of a silver halide emulsion and a film layer which contains nuclei for physical development and to which an image formed in said emulsion layer is transferred from the emulsion layer, the improvement comprising applying to said support a direct-positive silver halide emulsion which comprises silver chlorobromide, silver iodobromide, silver chloroidobromide or silver bromide grains containing at least 80 mol % of bromide, the surface of which has an electron acceptor and at least one sensitizing dye selected from the group consisting of those having the following general formula (I)

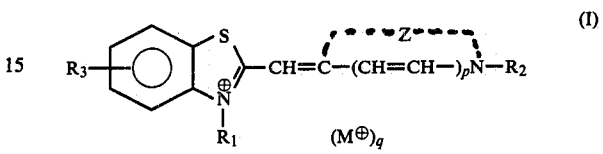

and those having the following general formula (II):

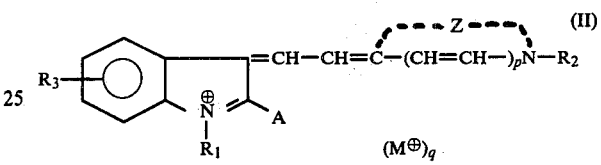

(wherein Z represent non-metal atom group necessary to complete a 5- or 6-membered nitrogen-containing heterocyclic nucleus, at least one of $R_1$ and $R_2$ represents a sulfoalkyl group of 1–5 carbon atoms or a carboxyalkyl of 1–5 carbon atoms and the remainder of $R_1$ and $R_2$ represents an alkyl group of 1–5 carbon atoms, a substituent-containing alkyl group of 1–5 carbon atoms, an aralkyl group, an aryl group or an alkenyl group of 1–5 carbon atoms, $R_3$ represents nitro group, a halogen atom or hydrogen atom, A represents an aryl group, M represents an alkali metal atom or ammonium group and p and q each represents 0 or 1) and which is fogged with a compound of a metal more electropositive than silver without a reducing agent and wherein said film layer containing nuclei for physical development has a thickness less than 20–30 Å.

* * * * *